(12) United States Patent
Jilek, Sr. et al.

(10) Patent No.: US 9,127,354 B2
(45) Date of Patent: Sep. 8, 2015

(54) FILTERED CATHODIC ARC DEPOSITION APPARATUS AND METHOD

(71) Applicant: Platit A.S., Sumperk (CZ)

(72) Inventors: Mojmir Jilek, Sr., Sumperk (CZ);
Mojmir Jilek, Jr., Sumperk (CZ);
Olivier Coddet, Biel (CH)

(73) Assignee: Platit A.S. (CZ)

( * ) Notice: Subject to any disclaimer, the term of this patent is extended or adjusted under 35 U.S.C. 154(b) by 0 days.

(21) Appl. No.: 14/362,301

(22) PCT Filed: Nov. 30, 2012

(86) PCT No.: PCT/EP2012/074147
§ 371 (c)(1),
(2) Date: Jun. 2, 2014

(87) PCT Pub. No.: WO2013/083495
PCT Pub. Date: Jun. 13, 2013

(65) Prior Publication Data
US 2014/0332370 A1    Nov. 13, 2014

(30) Foreign Application Priority Data
Dec. 5, 2011  (EP) .................................... 11191978

(51) Int. Cl.
| | |
|---|---|
| *C23C 14/34* | (2006.01) |
| *C23C 14/06* | (2006.01) |
| *C23C 14/08* | (2006.01) |
| *C23C 14/32* | (2006.01) |

(Continued)

(52) U.S. Cl.
CPC ......... *C23C 14/3414* (2013.01); *C23C 14/0605* (2013.01); *C23C 14/0641* (2013.01); *C23C 14/08* (2013.01); *C23C 14/325* (2013.01); *C23C 14/35* (2013.01); *C23C 14/54* (2013.01); *C23C 14/564* (2013.01); *H01J 37/32055* (2013.01); *H01J 37/3266* (2013.01); *H01J 37/32422* (2013.01); *H01J 37/32871* (2013.01); *H01J 37/3405* (2013.01); *H01J 37/3426* (2013.01); *H01J 37/3458* (2013.01)

(58) Field of Classification Search
CPC .............. C23C 14/325; H01J 37/32009; H01J 37/32055; H01J 37/32623; H01J 37/3266; H01J 37/3438
USPC ........................................ 204/298.41, 192.38
See application file for complete search history.

(56) References Cited

U.S. PATENT DOCUMENTS

| | | |
|---|---|---|
| 4,609,564 A | 9/1986 | Pinkhasov |
| 4,859,489 A | 8/1989 | Pinkhasov |

(Continued)

FOREIGN PATENT DOCUMENTS

| | | |
|---|---|---|
| EP | 0 508 612 A2 | 10/1992 |
| WO | WO 99/41425 | 8/1999 |

(Continued)

*Primary Examiner* — Rodney McDonald
(74) *Attorney, Agent, or Firm* — George Pappas

(57) ABSTRACT

Vacuum deposition apparatus including cathodic arc source for application of coatings on the substrate. Cathodic arc source comprises focusing magnetic source for generating magnetic field, arc cathode containing film forming material and anode. The focusing magnetic source is placed between arc cathode and substrate. Arc spot generated on the cathode evaporation surface is kept by the magnetic field lines in the place where the magnetic field lines are perpendicular to the cathode surface.

21 Claims, 11 Drawing Sheets

(51) Int. Cl.
*C23C 14/35* (2006.01)
*C23C 14/54* (2006.01)
*C23C 14/56* (2006.01)
*H01J 37/32* (2006.01)
*H01J 37/34* (2006.01)

(56) References Cited

U.S. PATENT DOCUMENTS

| | | |
|---|---|---|
| 5,037,522 A | 8/1991 | Vergason |
| 5,127,030 A | 6/1992 | Annis et al. |
| 5,269,898 A | 12/1993 | Welty |
| 5,279,898 A | 1/1994 | Evans et al. |
| 5,292,944 A | 3/1994 | Atadan et al. |
| 5,317,235 A | 5/1994 | Treglio |
| 5,435,900 A | 7/1995 | Gorokhovsky |
| 5,468,363 A | 11/1995 | Falabella |
| 5,799,549 A | 9/1998 | Decker et al. |
| 6,103,074 A | 8/2000 | Khominich |
| 6,361,663 B1 | 3/2002 | Berthold et al. |
| 2003/0193031 A1 | 10/2003 | Sathrum |
| 2004/0103845 A1 | 6/2004 | Gorokhovsky |
| 2007/0209934 A1* | 9/2007 | Meyer ............ 204/298.41 |
| 2009/0065350 A1 | 3/2009 | Anders |

FOREIGN PATENT DOCUMENTS

| | | |
|---|---|---|
| WO | WO 03/087425 A1 | 10/2003 |
| WO | WO 2010/134892 A1 | 11/2010 |

* cited by examiner

Fig. 14
Fig. 15
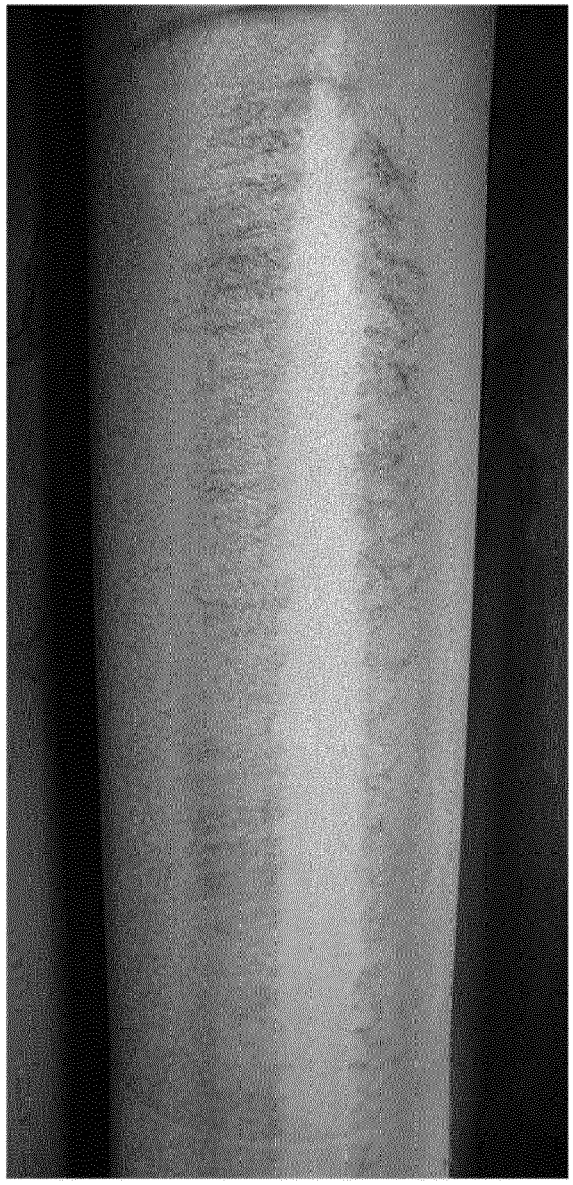

FILTERED CATHODIC ARC DEPOSITION APPARATUS AND METHOD

This application claims priority from PCT application No. PCT/EP2012/074147 filed Nov. 30, 2012 which claims priory from European application No. EP 11191978.3 filed on Dec. 5, 2011, the disclosures of which are incorporated herein by reference.

FIELD OF INVENTION

Filtered cathodic arc deposition method and apparatus where efficient ion transport and macroparticles filtering are desired.

BACKGROUND OF INVENTION

The present invention relates to a cathodic arc deposition method and apparatus. More particularly a cathodic arc deposition method and an apparatus, which generates a plasma of electrically conducting materials for the application of coatings to surfaces of a substrate by way of condensation of evaporated material. This apparatus, which includes means for separating source material macroparticles from the ion stream, can be used for forming a high quality wear resistant coating on cutting tools, forming tools and mechanical components and alike.

Cathodic arc deposition principally includes generating a vapor emission of a film forming material from an evaporation source (cathode) by arc discharge in a vacuum chamber, and depositing the vapor on a substrate under the application of a negative bias voltage. One or more arc spots, where the arc discharge is focused, are formed on the surface of the evaporation source, which is the cathode in an arc discharge circuit. Typical arc currents range between 50 to 500 amperes, with voltages between 15 to 50 volts. The arc plasma discharge conducts electric current between a cathode and an anode through the plasma created by vaporization and ionization of the target material by the arc. The target is vaporized by a low voltage arc plasma discharge in a vacuum chamber, which has been evacuated to a typical background pressure of at least 0.01 Pascal. The cathode (negative electrode) is an electrically isolated source structure, which is at least partially consumed during the process. The consumable portion of the cathode is called the "target" and is fabricated as a replaceable element clamped to a cooled, non-consumable element called the cathode body. The anode (positive electrode) may be an electrically isolated structure within the vacuum chamber or may be the vacuum chamber itself, and is not consumed during the process.

From an arc spot, ions, neutral atoms, macroparticles of source material, and electrons are emitted in a beam due to the high temperature at the arc spot. These ionized particles are emitted preferably perpendicular to the cathode target surface. Ions of source material, which form a plasma together with the emitted electrons, are the species of primary importance in the film deposition. One characteristic feature of cathodic arc deposition is that the energy of the incident evaporated ions is high enough to produce a high-density film with excellent hardness and wear resistance. In case of carbon evaporation, according to U.S. Pat. No. 5,799,549 of Decker, the invention has particular utility for forming a very hard and rigid coating of high aspect ratio on very thin cutting edges of razor blades. More than that, the rapid film formation and high productivity of the technique have been industrial application.

An undesirable side effect of the vaporization of the target material at the arc spot is the generation of droplets of molten target material, which are ejected from the target by reaction forces due to expansion of the vapor at the arc spot. These droplets, often called macroparticles, typically range in diameter from sub-micron to tens of microns. The droplets travel outward from the cathode surface at such velocities that they often become imbedded in the coating when they land on the substrate to be coated. Thus, cathodic arc coatings are often contaminated with macroparticles that adhere to the substrate surface, or leave holes where they once clung but have since been removed. The adhering macroparticles increase the friction coefficient between the coated work piece and the contact partner. As a result, the soft macroparticles leave holes and these represent sites for corrosion to initiate or cracks to propagate.

Thus, there is a significant, continuing need for industrial methods and apparatus to prevent or reduce the deposition of macroparticles while forming uniform, adherent carbon or metal compound coatings on substrate surfaces.

Various strategies have been developed to decrease the number of macroparticles incorporated into the coating. There are generally two different strategies: a first category of apparatus using some form of electromagnetic field to control and accelerate the arc, thus reducing macroparticles generation, and a second category using a filtering apparatus between the cathode source and the substrate so as to transmit the ionized fraction to the substrate, but to block the molten droplets. Conventionally a filtering apparatus may be constructed that uses electromagnetic fields, which direct or deflect the plasma stream.

Because macroparticles are neutral, they are not influenced by the electromagnetic field. That is why filtering methods work efficiently by placing the substrate out of the line of sight of the cathode target surface, so that macroparticles do not land directly on the substrate whereas arc spot acceleration methods are generally simpler but do not completely eliminate the macroparticles presence. A filtering apparatus according to the second category can provide a plasma angled filtering duct between the cathode chamber and a coating chamber, wherein the substrate holder is installed out of the optical axis of the plasma source. Focusing and deflecting electromagnetic field around the apparatus thus direct the plasma stream towards the substrate, while the macroparticles, uninfluenced by the electromagnetic field, continue to travel in a straight line from the cathode. However, bouncing of macroparticles off the baffles in the duct can result in transmission of some portion of them through the filter to reach the substrate. Baffles, also called macroparticle firewall, within the chamber physically block neutral particles emanating from the arc source and filter region as mentioned in US 2009/0065350 A1 of Anders.

The arc spot acceleration methods of the first category are generally simpler than the filtering methods, but do not completely eliminate the macroparticles generation. Whereas the filtering methods can generally be more effective, they bring additional complexity to the apparatus and reduce tremendously its yield. Examples of efforts to reduce the number of macroparticles incorporated into the coating on the substrate by using some kind of a filtering apparatus between the cathode source and the substrate to transmit the charged ionized fraction of the emitted particles and to block the neutral particles are shown below.

Another example is described and illustrated in U.S. Pat. No. 5,435,900 and in US 2004/103845 A1 by Gorokhovsky for a "Filtered Cathodic Arc Deposition Method And Apparatus". This mechanical filtering mechanism traps macroparticles by altering the path of the plasma stream out of the optical axis of the plasma source toward the substrate, and trapping macroparticles in a baffle disposed generally along the optical axis of the cathode. However there is no direct line-of-sight from the target material to the substrate holder. For this reason, the apparatus incorporates a plasma duct surrounded by the deflecting magnetic system, a plasma source and a substrate holder mounted in the coating chamber out of the optical axis of the plasma source, where the plasma source and the substrate holder are surrounded by the focusing electromagnets. However the distance between the target material and the substrate holder is much too large to ensure that a significant portion of the charged particles will reach the substrate. In our present apparatus, this distance has been minimized to overcome this issue and improve the system yield. Also our apparatus introduces use of rotary arc cathode consumable on its outer cylinder jacket in contrary to use of fixed, flat cathode as proposed in above mentioned patent.

In WO 2010/134 892 A1 a filtered cathodic arc deposition apparatus having a rotatable cathode is disclosed, but instead of using rotary arc cathode consumable on its outer cylinder jacket, arc cathode consumed on base of cylinder is used.

Use of a cylindrical plasma duct containing a 90 degree bend, with electromagnetic coils to create a solenoidal magnetic field through the duct, and with a circular arc evaporation cathode at one end of the duct and a substrate at the other end. Prior filtered cathodic arc apparatus have been based upon circular and flat or cylindrical cathode and filter geometry, generally limiting the field of applications because of their low transmission. Examples of elongated, cylindrical cathodes are included in U.S. Pat. Nos. 4,609,564 and 4,859,489 of Pinkhasov; U.S. Pat. No. 5,037,522 of Vergason; and U.S. Pat. No. 5,279,898 of Welty, all of which describe the use of an elongated cathode in the form of a cylinder or rod, and make use of the self-magnetic field of the arc current to force its motion along the length of the cathode. Welty teaches that macroparticles generation can be reduced by application of an additional axial magnetic field component to accelerate and control the arc motion. This is realized by connecting both ends of the cathode to an additional power supply, which delivers a current through the target material creating a circumferential magnetic field around the target to control the arc longitudinal motion. Our advantage is that the cathode is connected only to its head with an arc cable. In addition to that, the arc spot sensors detect efficiently the position of the arc spot and the cathode rotation helps keeping the arc spot in its optimum location.

U.S. Pat. No. 5,127,030 of Tamagaki and U.S. Pat. No. 5,317,235 of Treglio describe a straight cylindrical filtering duct with no bend, a circular cathode located at one end of the duct, electromagnetic coils to generate the solenoidal magnetic field through the duct and partially block the direct line of sight deposition from the cathode to the substrate. Plasma emitted by the cathode is focused by the electromagnetic field at the system optical axis. An arc confinement ring (so-called anode) to stabilize an arc is located around the target. A coil which resulting magnetic field is perpendicular to the target surface at the center, is compressing the magnetic lines to bring the charged particles toward the substrate. The arc spots burn on the round flat target (mostly to the outer area in the filtering mode) at a high velocity. The neutral macroparticles are not deflected by the electromagnetic field and are blocked by the coil duct. When coating over a large area is required, a substrate is arranged considerably apart from the coil to utilize a plasma flow that spreads along a magnetic field. However this decreases the apparatus growth rate enormously and limits its usage. The key point is the anode location. Unlike the previous two references where the anode surrounds the target material, the anode is located between the source of magnetic field and the substrate in our present case.

U.S. Pat. No. 5,292,944 of Sanders and WO 03/087425 A1 of Sathrum introduce cylindrically symmetric arc sources which operate in an arched field geometry. The emitted ions leave the surface radially and are reflected by an electromagnetic field. In the first reference, the charged particles have to deflect their trajectories by 90° and even 180° in the second reference which is not as favorable for the filter efficiency as a straight duct detailed hereafter.

None of the references of the prior art disclose a rotary arc cathode having an evaporable surface of cylindrical shape and using mostly external magnetic field in addition to an internal magnetic field to control the movement of the arc on the cathode surface, nor is a filtering duct having the external magnetic field source into the vacuum chamber used as extractor for charged particles and baffle for macroparticles. The anode position plays an important role in the output of this source since it is located between the magnetic field source and the substrate.

Filtered cathodic arc sources have the advantage that the stream of vapor of cathode material emitted from the source is fully ionized, unlike non-arc-based deposition methods such as evaporation and sputtering. The fully ionized vapor stream from a cylindrical cathode would allow greater control over the target utilization as well as the energy of the particles reaching the substrate for coating or ion implantation, and would increase the reactivity of the vapor in forming compounds with reactive gases in the system, or with the substrate directly.

The present invention realizes the benefits of a filtered cathodic arc (fully ionized vapor stream, elimination of splattered macroparticles) and the benefits of a cylindrical rotating arc cathode (uniform target evaporation and uniform deposition on the substrate using linear motion and arc spot position detection) with high throughput. Moreover the invention is a compact system that can upgrade the regular cylindrical rotating arc cathodes (LARC®) technology. An easy system accessibility and maintenance make the invention user-friendly, which could not be accomplished by the prior art.

SUMMARY OF THE INVENTION

Object of invention is to provide filtered cathodic vacuum arc deposition apparatus, producing a highly ionized metal vapor for dense smooth coatings working at least partly in macroparticle filtering mode.

Another object of invention is to minimize electron diffusion along plasma channel, so that most of ions do reach the substrate surface and ensure high deposition rate.

Another object of invention is to provide filtered cathodic vacuum arc deposition apparatus, with as small amount of construction changes as possible compared to non-filtered cathodic vacuum arc deposition apparatus.

Another object of invention is to provide a flexible device which can be used either as a filtered or unfiltered cathodic vacuum arc deposition apparatus within minor changes.

Another object of invention is to provide device which is capable of oxide and nitride layers PVD deposition with high ionization degree of particles involved in the deposition and low roughness of deposited layer.

Another object of invention is to provide device which is capable of carbon layers PVD deposition with high ionization degree of particles involved in the deposition and low roughness of deposited layer.

The present invention involves a filtered cathodic vacuum arc source for thin film deposition, using rotary arc cathode substantially having cylindrical shape containing film forming material. Said rotary arc cathode is consumable on its outer cylinder jacket.

These and other objects of the invention are solved by providing filtered cathodic vacuum arc source comprising focusing magnetic field source, consumable rotary arc cathode substantially having cylindrical shape containing film forming material and anode, wherein focusing magnetic field source is placed between arc cathode and substrate holder, wherein arc spot generated on the target surface is kept by the magnetic field lines in the place where the magnetic field lines are perpendicular to the target surface, wherein magnetic field lines are constricted in the space between rotary arc cathode and substrate holder, wherein the space where the magnetic field lines are constricted is limited by baffle.

It is advantageous when magnetic field lines are constricted in the baffle as much as possible.

It is also advantageous when magnetic field lines are diverging with increasing distance from the center of focusing magnetic field source towards the rotary arc cathode as much as possible. Diverging of magnetic field lines can be influenced by additional magnetic field source, which is placed in cathode and which is oriented against focusing magnetic field source.

It is also advantageous when magnetic field does not change orientation between focusing magnetic field source and target surface, so additional magnetic field source should be energized only to the level, where it diverges magnetic field lines, but does not change their orientation between focusing magnetic field source and target surface.

It is also advantageous when focusing magnetic field source is made of elongated electromagnetic coil and its central region of highest intensity of magnetic field is placed on line, which is substantially parallel to the rotary arc cathode axis.

Plasma channel of the arc is propagating along magnetic field lines—starting at the place where arc spot burns (place where magnetic field lines are entering target perpendicular to the target surface), further through the center of the baffle (which is positioned in center of focusing magnetic field source), further through the substrates and then the plasma channel is terminated at the surface of anode. It is advantageous when anode is positioned on the same magnetic field line as arc spot. When we position anode further from this optimal position, arc voltage is increasing rapidly.

Magnetic field of the shape described above in conjunction with positioning of anode as described above ensures, that stable region of arc burning on target surface is place where magnetic field lines are entering the target perpendicular to the surface. This place of stable arc burning is usually line on target surface, so it is highly advantageous to use rotary arc cathode substantially having cylindrical shape consumable on its outer cylinder jacket to have uniform target erosion around the cathode. To see example of the place of stable arc burning on aluminum cathode according to above described method.

When using above described guidance of plasma channel by magnetic field lines, arc is burning in well-defined narrow space and therefore it is possible to ensure filtration of macroparticles very effectively by narrowing of baffle, which is positioned in center of focusing magnetic field source.

By having high magnetic field intensity not only in the center of focusing magnetic field source, but in the whole area between rotary arc cathode and focusing magnetic field source, the efficiency of filtration increases significantly.

It is also advantageous when focusing magnetic field source is created by elongated electromagnetic coil placed in water cooled housing made of nonmagnetic material (which can be placed directly into coating chamber and it can also play role of baffle). It is advantageous if elongated electromagnetic coil is positioned in a way that it is as close to center of housing as possible, so that narrowing of magnetic field lines and magnetic field intensity in the center of housing is maximal. When focusing magnetic field source if made this way, it is possible to rapidly increase intensity of magnetic field generated by elongated electromagnetic coil and decrease its dimensions. By decreasing of focusing magnetic field source dimensions, it is possible to place the elongated electromagnetic coil in standard coating device without significant changes in its dimensions.

For low arc spot speed target materials (for instance graphite), it is possible to shift arc spot from the place where magnetic field lines are entering target perpendicular to the target surface to the place of higher magnetic field component which is tangential to the target surface by rotating the target. By this way it is possible to definably accelerate arc spot in vertical direction, so by the change of rotation speed it is possible to effectively control uniformity of evaporation along the whole target length.

This system can be used in various modes:

- The arc is ignited by arc generator at first end of target, by rotation of target, arc spot starts to move to the second end of the target. At the moment when arc spot is reaching second end of the target, its position evaluated by arc position sensor and the arc is switched off. Afterwards arc is re-ignited by arc generator at first end of target again.
- The arc is ignited by arc generator at first end of target, by rotation of target, arc spot starts to move to the second end of the target. At the moment when arc spot reaches second end of the target, its position is evaluated by arc position sensor and direction of target rotation is reversed, so that cathode spot starts to move in opposite direction. By repeating this method, it is possible to provide continuous arc burning. It is also advantageous when rotation speed of target at the beginning and after rotation change slightly differ, so that uniform target erosion can be provided.
- The arc is ignited by arc generator at first end of target and by rotation of target, arc spot starts to move to the second end of the target. At the moment when arc spot reaches second end of the target, its position is evaluated by arc position sensor and direction of magnetic field is reversed, so that cathode spot starts to move in opposite direction. Both focusing magnetic field source and additional magnetic field source have to be reversed at the same time. By repeating this method, it is possible to provide continuous arc burning.

For high arc spot speed target materials (for instance Ti, Al), it is not possible to shift arc spot by target rotation as described above with standard target rotation speed. It is necessary to use higher target rotation speed, which is not always technologically suitable. At this case one of the following methods can be used:

- When using higher arc current (in the order of 1000 A), arc spot burning area expands over target length. In this case it is advantageous to work in a pulsed regime of arc current source. Parameters of pulses can be for example: pulse duration 10 ms, pulse current 1000 A (active part of the pulse), pulse duration 100 ms, pulse current 50 A (passive part of the pulse).

When using elongated electromagnetic coil with ferromagnetic core which is limited only to a fraction of the whole length of the target as additional magnetic field source, we can control vertical position of arc spot by moving ferromagnetic core vertically in elongated electromagnetic coil, arc spot burns in the place of actual ferromagnetic core position.

To provide more control over the arc spot movement, additional anode is provided. Fraction of current can be diverted from the main anode to the additional anode. By this, we can force arc spot to move at a closed curve. We also lose some ions because the plasma channel does not only run through the focusing magnetic field source around samples, but a fraction of plasma channel is also diverted to the additional anode. It should be emphasized that voltage required to divert this current is significantly higher than the voltage required to burn the arc against the standard anode.

Because the evaporation occurs only from a narrow place on the target in front of focusing magnetic field source, we can substantially decrease distance between target and focusing magnetic field source to help increase yield of the system. Moreover if a 100% filtration is required with help of plasma channel bending, it can be realized with a minimum bending of this plasma channel.

Another advantage is that intensity of the magnetic field is very high along whole plasma channel, so there is no space along plasma channel with low magnetic field intensity, where substantial electron and consequently ion loss can occur.

Another advantage is that if an elongated electromagnetic coil in well-designed water-cooled housing is used as focusing magnetic field source, its dimensions can be minimized and therefore this macroparticle add-on can be installed into existing non-filtered cathodic vacuum arc deposition apparatus with only a small amount of construction changes. It is then possible to use this apparatus in both filtered and non-filtered regime, depending on requested coating application.

BRIEF DESCRIPTION OF THE DRAWINGS

FIG. 14 is a picture showing arc spot track on the outer cylinder jacket of graphite target with rotary arc cathode rotation switched on.

FIG. 15 is a picture showing arc spot track on the outer cylinder jacket of aluminum target with rotary arc cathode rotation switched off.

DESCRIPTION OF PREFERRED EMBODIMENT

Figure 1:
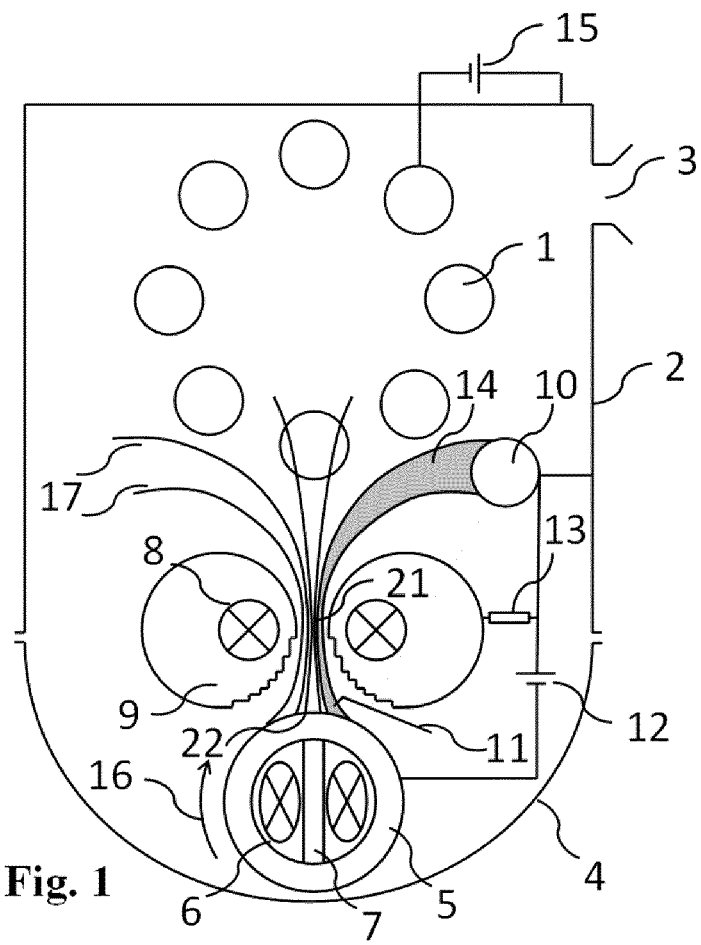
FIG. 1 is schematic drawing of filtered cathodic vacuum arc source of the present invention using one consumable rotary arc cathode substantially having cylindrical shape, focusing magnetic field source made by elongated electromagnetic coil, where plasma channel is bent to the side.
Figure 2:
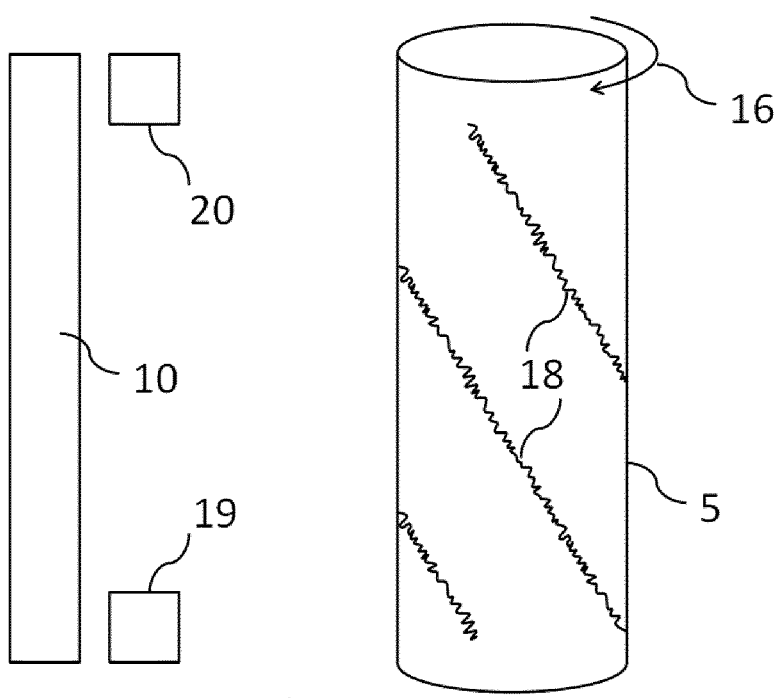
FIG. 2 is schematic drawing illustrating the arc spot tracks direction on graphite and arc position sensor location.

In FIG. 1 and FIG. 2 a schematic drawing showing the basic configuration of the invention suitable mainly for graphite targets is presented. Substrate holder with work pieces to be coated 1 is placed within the coating chamber 2, which is evacuated by connection to the pumping system 3. Filtered cathodic vacuum arc source placed within the door 4 consist from consumable rotary arc cathode substantially having cylindrical shape (created by target 5, additional magnetic field source made by elongated electromagnetic coil 6 and ferromagnetic core 7), focusing magnetic field source (made by elongated electromagnetic coil 8 placed within water cooled baffle 9), water cooled anode 10, arc generator 11, current source 12 and resistor 14.

Target material is evaporated at the arc spot positioned on the target 5 surface inside the plasma channel 14. The electron stream inside the plasma channel 14 guides the positively charged evaporated material through the baffle 9. The baffle is charged by the resistor 13 to positive potential which helps to keep the charged material inside the plasma channel. As the plasma channel 14 passes by or through the substrates the positively charged evaporated material is pulled by the negative potential made by the substrate bias source 15 and creates coating on the substrates.

Said rotary arc cathode rotation 16 shifts the arc spot which burns on the target 5 surface within the plasma channel 14 to the side where the magnetic field lines 17 are not perpendicular to the target 5 surface. The magnetic field moves the arc spot back to the place where the magnetic field lines 17 are perpendicular to the target 5 surface and along the target length on the arc spot track 18 to the bottom of the target 5.

Arc spot is ignited by arc generator 11 in the upper part of the target 5. When the arc spot reaches bottom part, the voltage increases on the arc position sensor 19 and the arc is switched off. Then the arc is ignited in the upper part again and the process is continually repeated.

Figure 3:
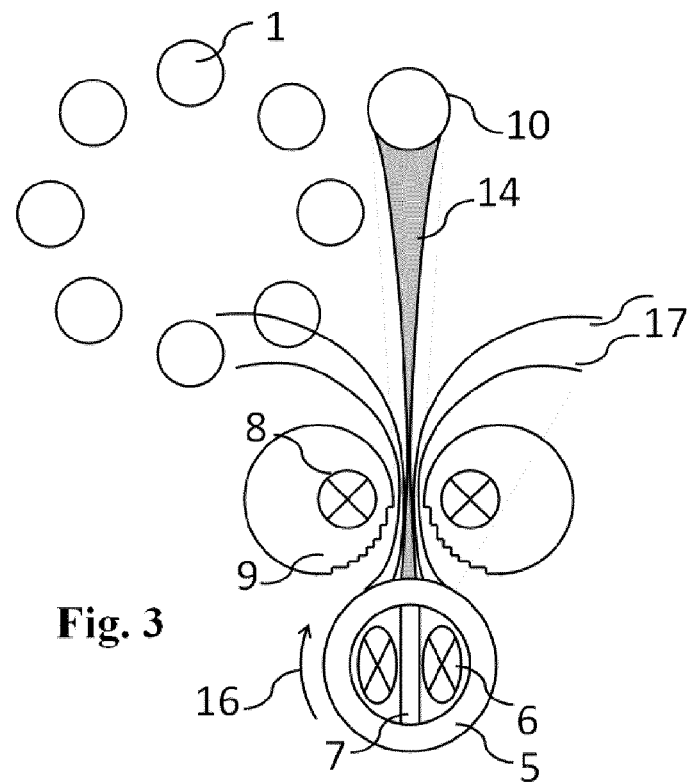
FIG. 3 is schematic drawing of filtered cathodic vacuum arc source of the present invention using one consumable rotary arc cathode substantially having cylindrical shape, focusing magnetic field source made by elongated electromagnetic coil, where straight plasma channel is set off to the substrate holder.

Optimum Conditions for Graphite Target
magnetic field intensity inside the baffle 21 is 100 mT
magnetic field intensity in the arc spot position 22 is 15 mT
baffle gap width is 10 mm
rotary arc cathode rotation speed 1.5 RPM
arc current 80 A In FIG. 3 a schematic drawing of alternative solution is presented. If the arc spot speed is too fast (for instance for Ti, Al target material) it is impossible to shift reasonably the arc spot to the side with help of rotation. Then the arc spot is kept all the time in the position where the magnetic field lines 17 are perpendicular to the cathode surface. The magnetic field lines 17 inside plasma channel are straight and it is advantageous if the baffle and rotary arc cathode are shifted to the side as seen on FIG. 3.

Figure 4:
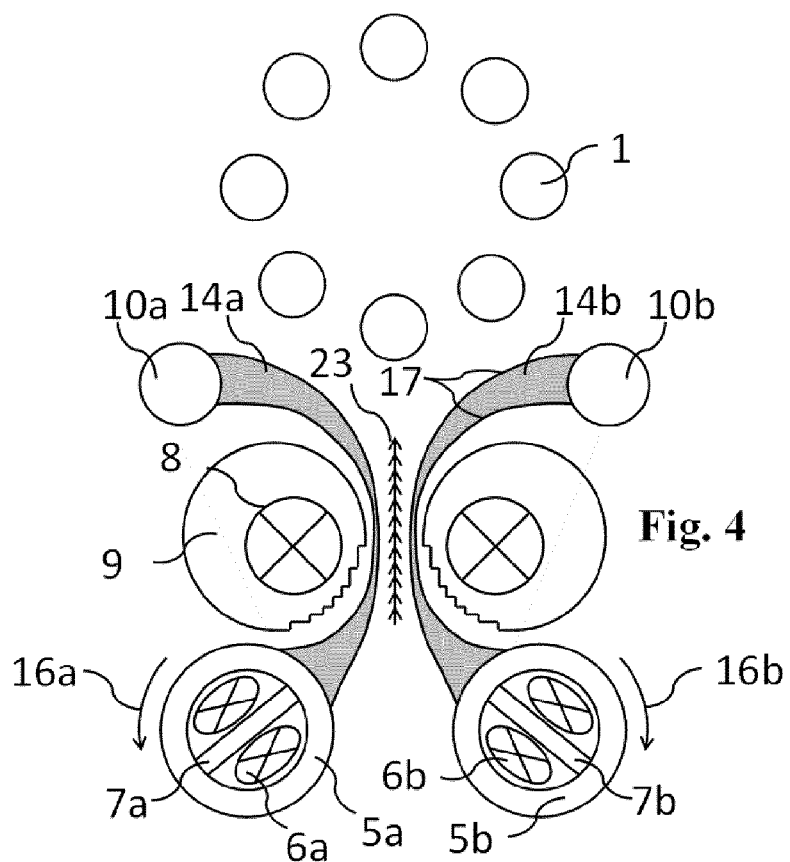
FIG. 4 is schematic drawing of dual filtered cathodic vacuum arc source of the present invention using two consumable rotary arc cathodes substantially having cylindrical shape, focusing magnetic field source made by elongated electromagnetic coil, where one focusing magnetic field source is used for both cathodes.

In FIG. 4 a schematic drawing of alternative solution is presented. Filtered cathodic vacuum arc source consists of two cathodes (composed from 7a, 6a, 5a, resp. 7b, 6b, 5b) and of bigger focusing magnetic field source (created by elongated electromagnetic coil 8 placed within water cooled baffle 9), of two anodes 10a, 10b and additional baffle 23 to provide better filtration. Magnetic field intensity is roughly twice higher compared to the previous solutions. System is suitable for low arc spot speed target materials (for instance graphite) and high arc spot speed target materials as well (for instance Ti, Al).

Figure 5:
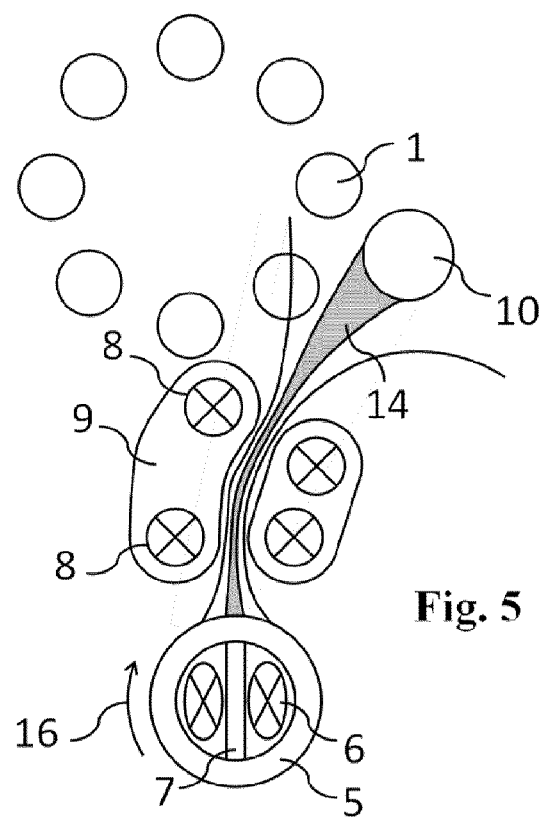
FIG. 5 is schematic drawing of filtered cathodic vacuum arc source of the present invention using one consumable rotary arc cathode substantially having cylindrical shape, focusing magnetic field source made by two elongated electromagnetic coils, where plasma channel is bent to the side.

In FIG. 5 a schematic drawing of alternative solution is presented. Focusing magnetic field source contains two elongated electromagnetic coils and the baffle creates bent plasma channel. System is suitable for low arc spot speed target materials (for instance graphite) and high arc spot speed target materials as well (for instance Ti, Al).

Figure 6A:
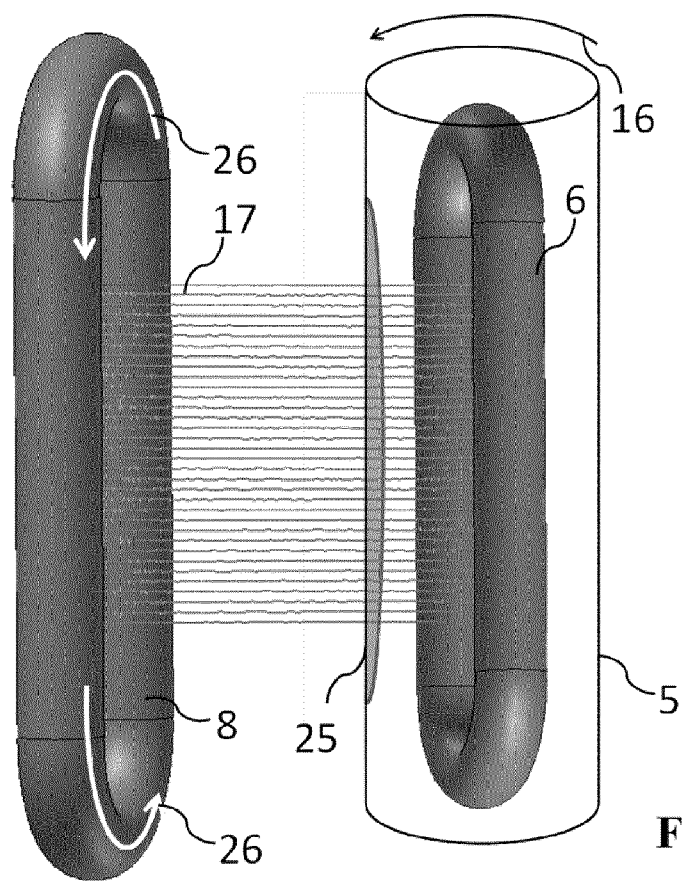
FIG. 6a is schematic drawing illustrating magnetic field lines and place where the arc spot burns when having additional magnetic field source switched off without ferromagnetic core. Current to the arc is substantially high.
Figure 6B:
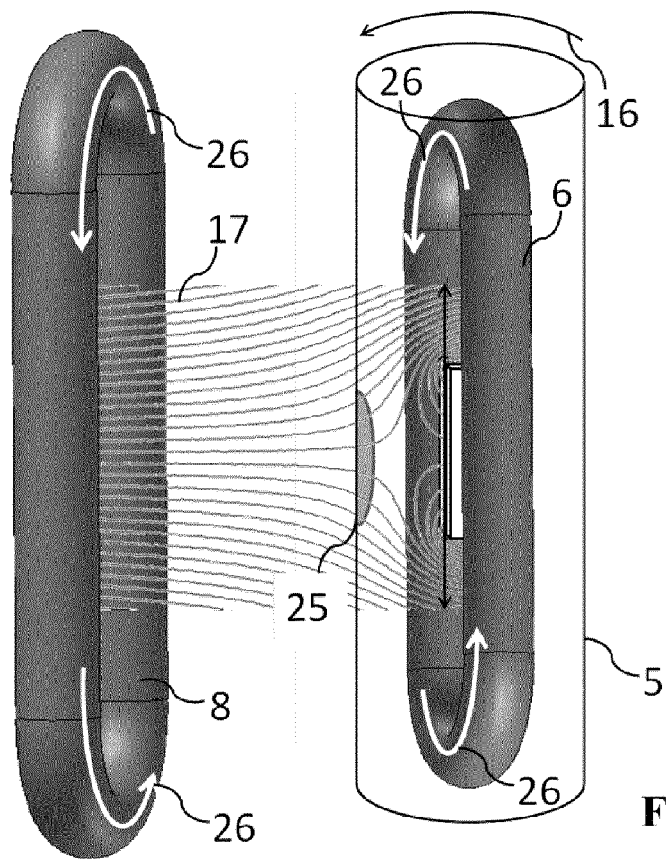
FIG. 6b is schematic drawing illustrating magnetic field lines and place where the arc spot burns when having additional magnetic field source switched on with ferromagnetic core. It illustrates how one can control with help of the vertical movement of ferromagnetic core inside the rotary arc cathode the place where the arc spot burns.

In FIG. 6b a schematic drawing of alternative solution is presented. To provide control of vertical position of the arc spot, a ferromagnetic core 7 is not placed over the complete length of the additional magnetic field source, but it is limited to a fraction of the whole length of the target 5. For target of length 40 cm, 7 cm length of ferromagnetic core 6 is suitable as it is seen on the FIG. 8. By mechanical vertical movement of the core one can control the arc spot movement. Arc spot follows the position of the ferromagnetic core.

Figure 6C:
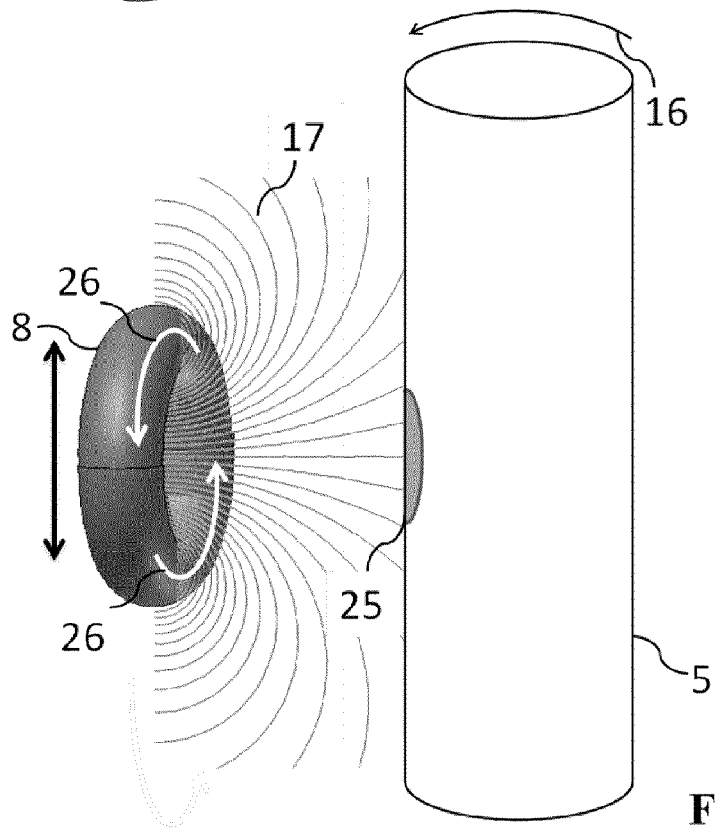
FIG. 6c is schematic drawing illustrating magnetic field lines and place where the arc spot burns when having focusing magnetic field source made of less elongated electromagnetic coil. It illustrates how one can control with help of the vertical movement of focusing magnetic field source the place where the arc spot burns.

In FIG. 6c a schematic drawing of alternative solution is presented. To provide control of vertical position of the arc spot, focusing magnetic field source made of less elongated electromagnetic coil is used. By mechanical vertical movement of the focusing magnetic field source one can control the arc spot movement. Arc spot follows vertical position of the focusing magnetic field source.

When using those additional means to control of the arc spot motion, one can use both upper voltage sensor 20 and bottom voltage sensor 19 to control if arc spot has reached its boundary position. This system was developed mainly for high arc spot speed target materials (for instance Ti, Al), but it is suitable for low arc spot speed target materials (for instance graphite) as well.

Figure 7:
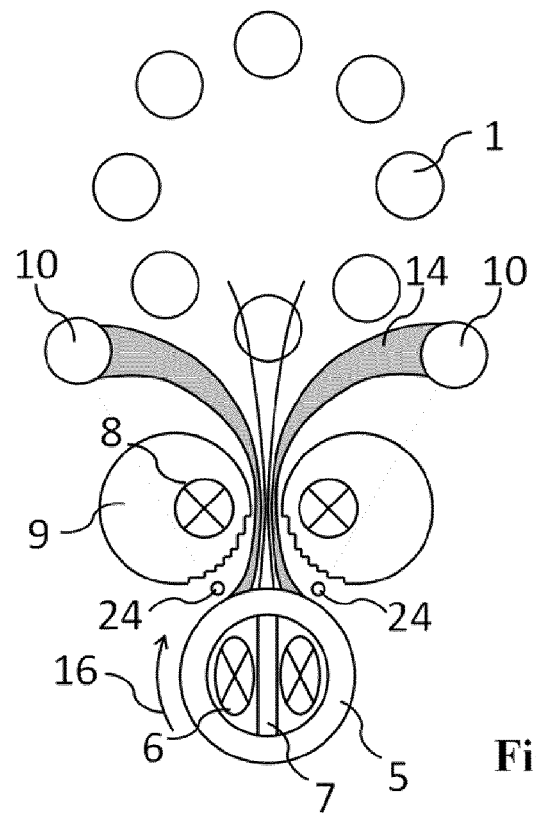
FIG. 7 is schematic drawing of filtered cathodic vacuum arc source of the present invention using one consumable rotary arc cathode substantially having cylindrical shape, focusing magnetic field source made by elongated electromagnetic coil and additional anode which, by draining a fraction of electron current, changes place where the arc spot burns.
Figure 8:
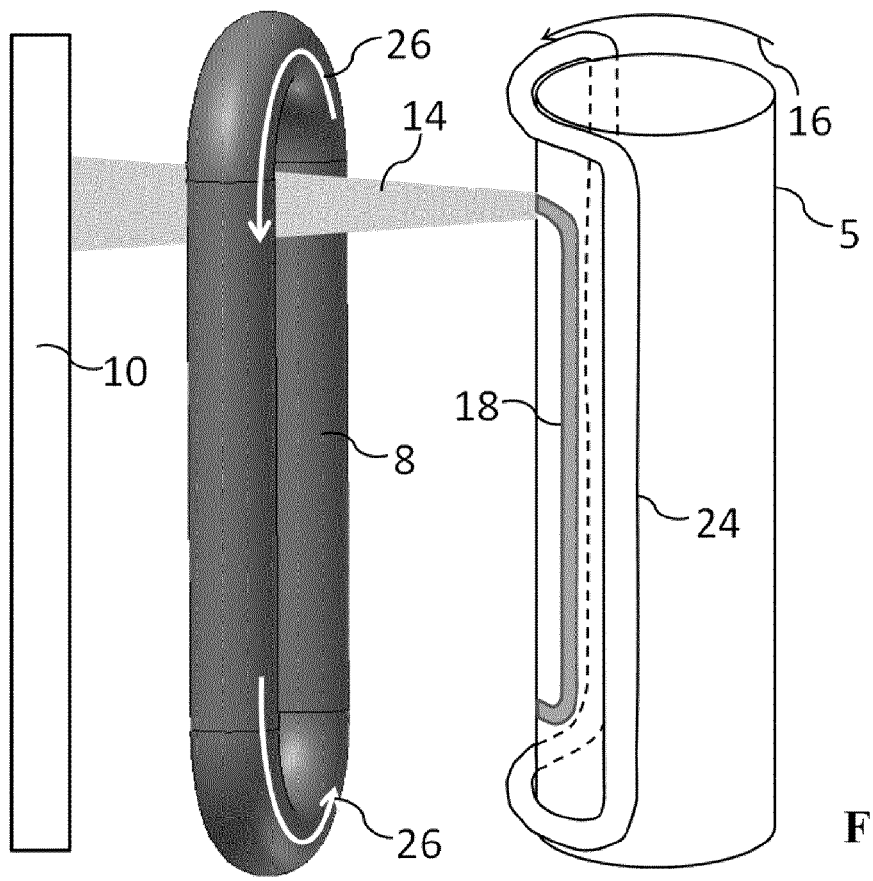
FIG. 8 is schematic drawing illustrating place where arc spot burns on FIG. 6.
Figure 9:
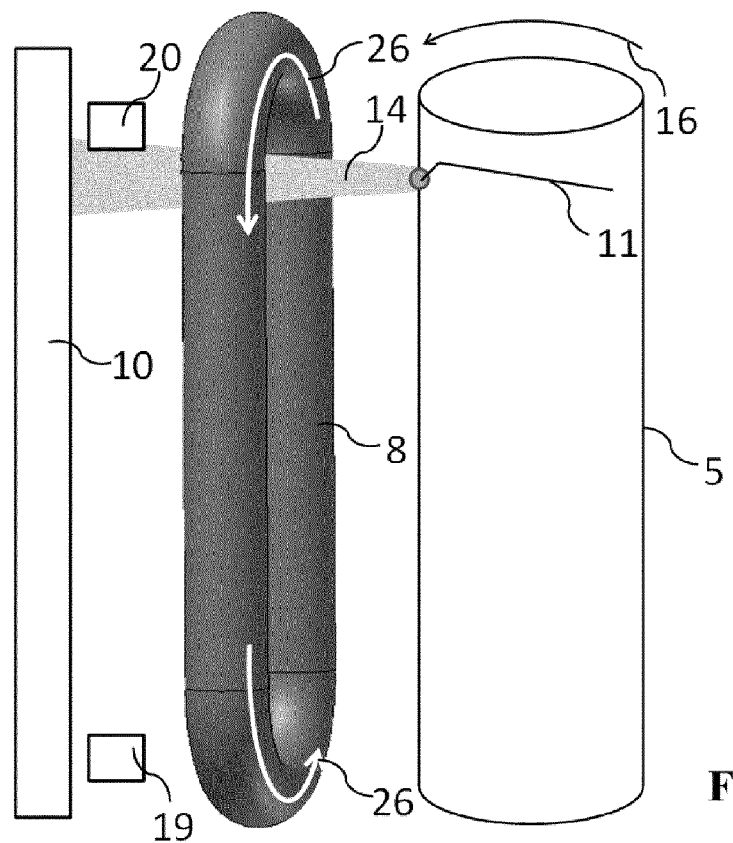
FIG. 9 is schematic drawing illustrating first stage of deposition method for low arc spot speed target materials—ignition of the arc by arc generator.

In FIG. 7 and FIG. 8 a schematic drawing of alternative solution is presented. To provide more control over the arc spot movement, additional anode 24 is provided. Fraction of current can be diverted from the main anode 10 to the additional anode 24. By this, one can force arc spot to move at the closed curve 18 shown schematically at FIG. 8. This system was developed mainly for high arc spot speed target materials (for instance Ti, Al), but it is suitable for low arc spot speed target materials (for instance graphite) as well.

Figure 10:
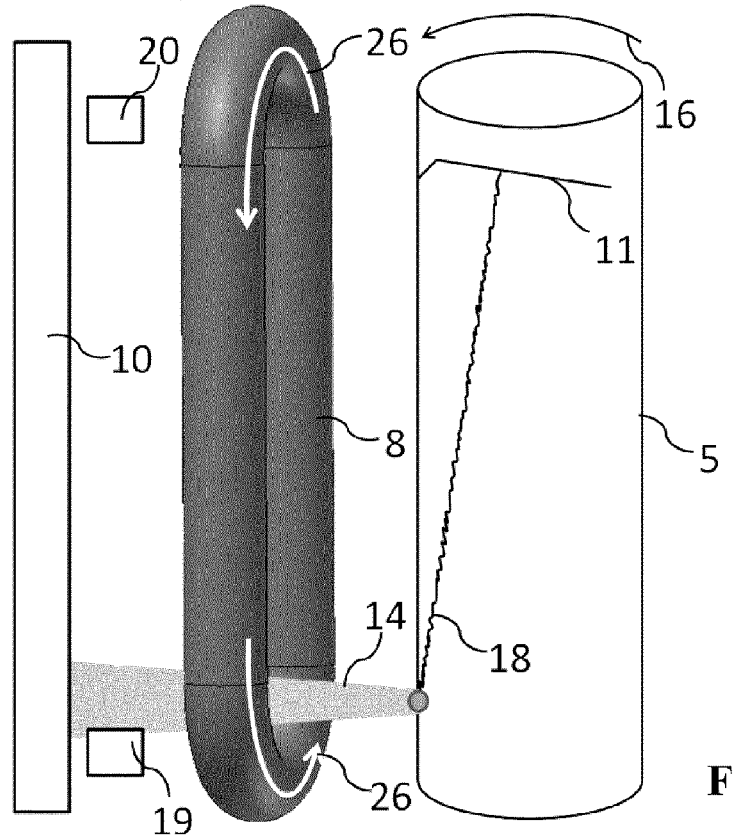
FIG. 10 is schematic drawing illustrating second stage of deposition method for low arc spot speed target materials—by rotation of target, arc spot starts to move to the second end of the target.
Figure 11:
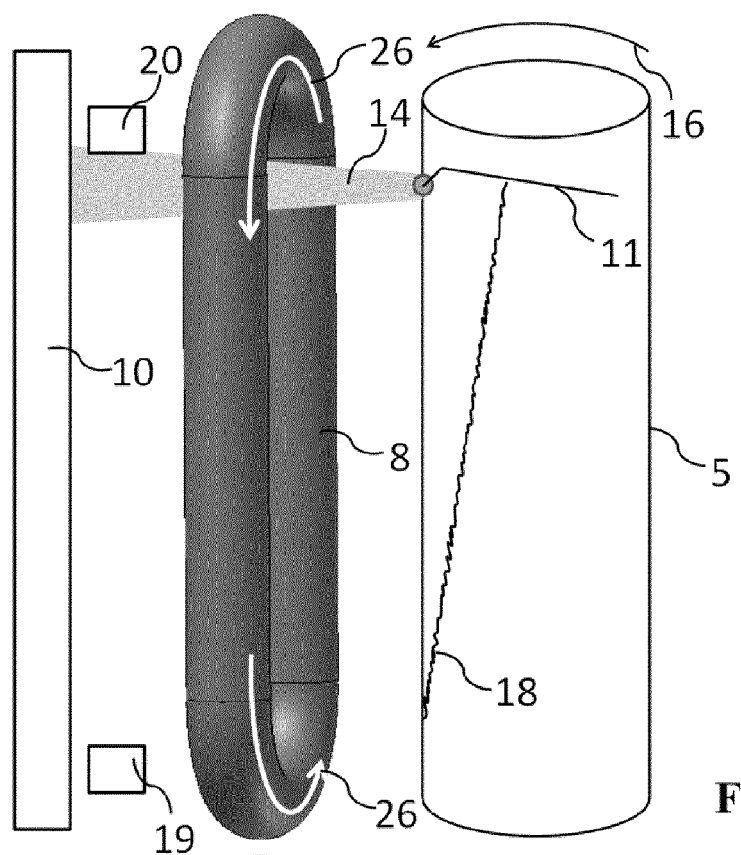
FIG. 11 is schematic drawing illustrating third stage of deposition method for low arc spot speed target materials—it refers to the mode of deposition, where arc is switched off, afterwards arc is re-ignited by arc generator at first end of target.
Figure 11:
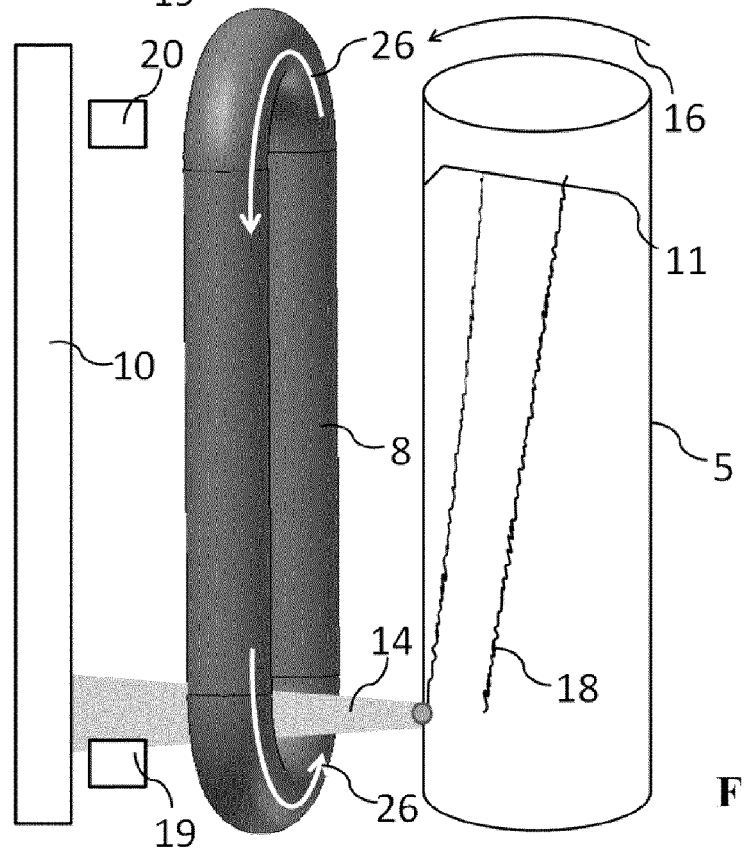
Figure 12:
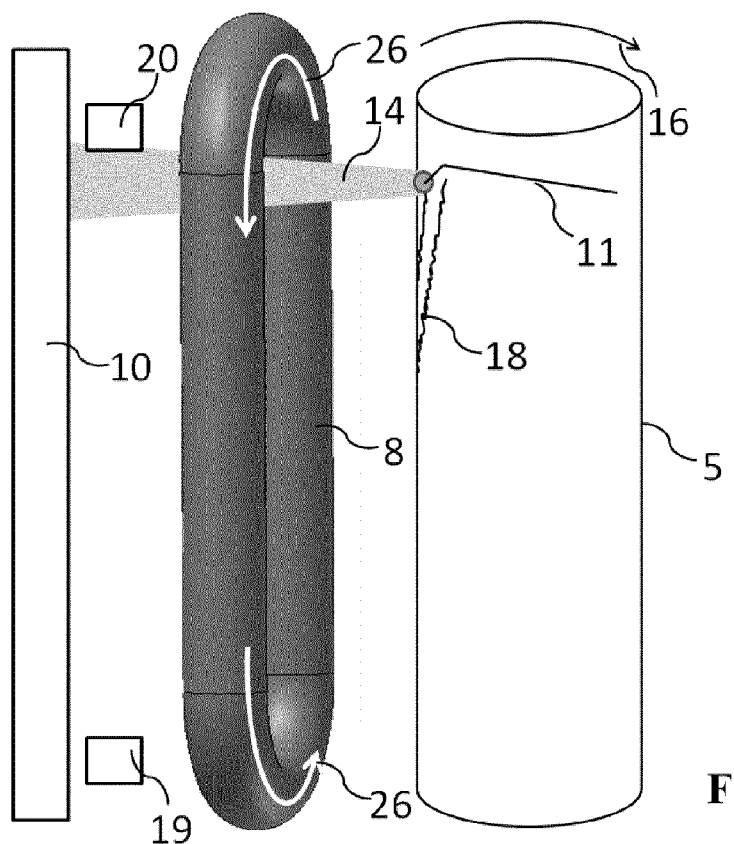
FIG. 12 is schematic drawing illustrating third stage of deposition method for low arc spot speed target materials—it refers to the mode of deposition, where rotation of target is reversed, so that cathode spot starts to move in opposite direction.
Figure 13:
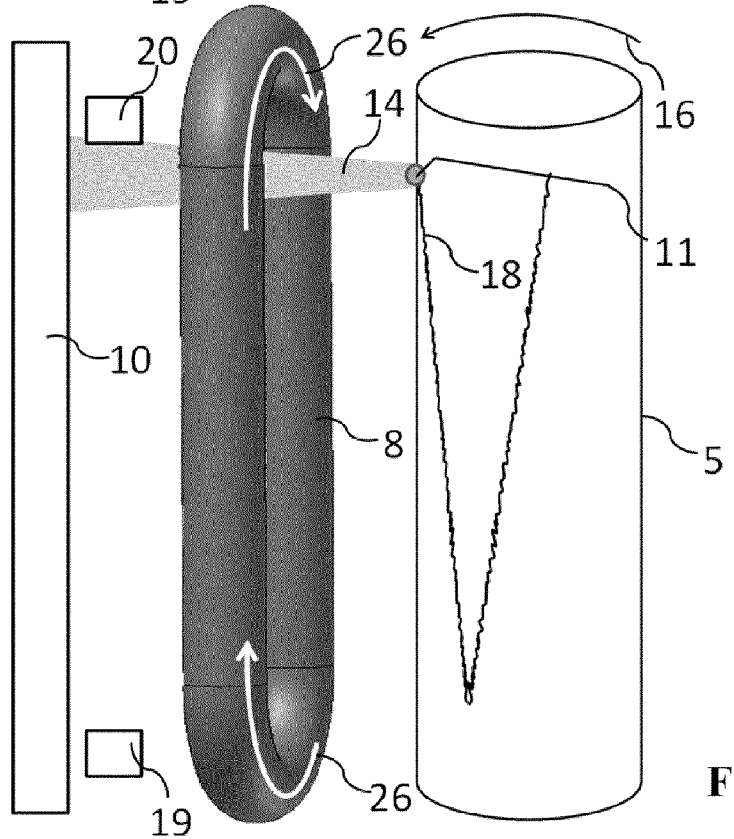
FIG. 13 is schematic drawing illustrating third stage of deposition method for low arc spot speed target materials—it refers to the mode of deposition, where direction of magnetic field is reversed, so that cathode spot starts to move in opposite direction.

In FIGS. 9, 10, 11, 12 and 13 a schematic drawing of deposition methods used for low arc spot speed target materials (for instance graphite) is presented. For low arc spot speed target materials (for instance graphite), it is possible to shift arc spot with the help of target rotation, to the place, where arc spot is accelerated in vertical direction. This system can work in various modes, which are presented in the above mentioned figures. Their description follows:

The arc is ignited by arc generator 11 at first end of target 5 (see FIG. 9), by rotation of target 5, arc spot starts to move to the second end of the target 5 (see FIG. 10). At the moment when arc spot reaches second end of the target (5), its position is evaluated by arc position sensor 19 and the arc is switched off. Afterwards arc is re-ignited by arc generator 11 at first end of target (see FIG. 11a). Then a new track parallel to the previous one in FIG. 10 is created (see FIG. 11b).

Photograph illustrating arc spot movement on graphite target is shown in FIG. 14.

The arc is ignited by arc generator 11 at first end of target 5 (see FIG. 9), by rotation of target 5, arc spot starts to move to the second end of the target 5 (see FIG. 10). At the moment when arc spot reaches second end of the target 5, its position evaluated by arc position sensor 19 and direction of rotation of target 5 is reversed, so that cathode spot starts to move in opposite direction. By repeating this method, it is possible to provide continuous arc burning. It is also advantageous when rotation speed of target 5 slightly differ between the beginning and after reversed rotation, so that uniform target 5 erosion can be provided (see FIG. 12).

The arc is ignited by arc generator 11 at first end of target 5 (see FIG. 9), by rotation of target 5, arc spot starts to move to the second end of the target 5 (see FIG. 10). At the moment when arc spot reaches second end of the target 5, its position is evaluated by arc position sensor 19 and direction of magnetic field is reversed by reversing of coil current orientation 26 in electromagnetic coil generating magnetic field, so that cathode spot starts to move in opposite direction. Both focusing magnetic field source 8 and additional magnetic field source 6 have to be reversed at the same time. By repeating this method, it is possible to provide continuous arc burning (see FIG. 13).

Instead of evaluation of arc spot reaching end of the target by sensor 19, 20, we can also calculate time needed for arc spot to move from one end of the target 5 to another end of the target from known cathode spot speed. After this time elapses, we can assume, that cathode spot had reached desired end of the target and do one of above mentioned actions.

Figure 16:
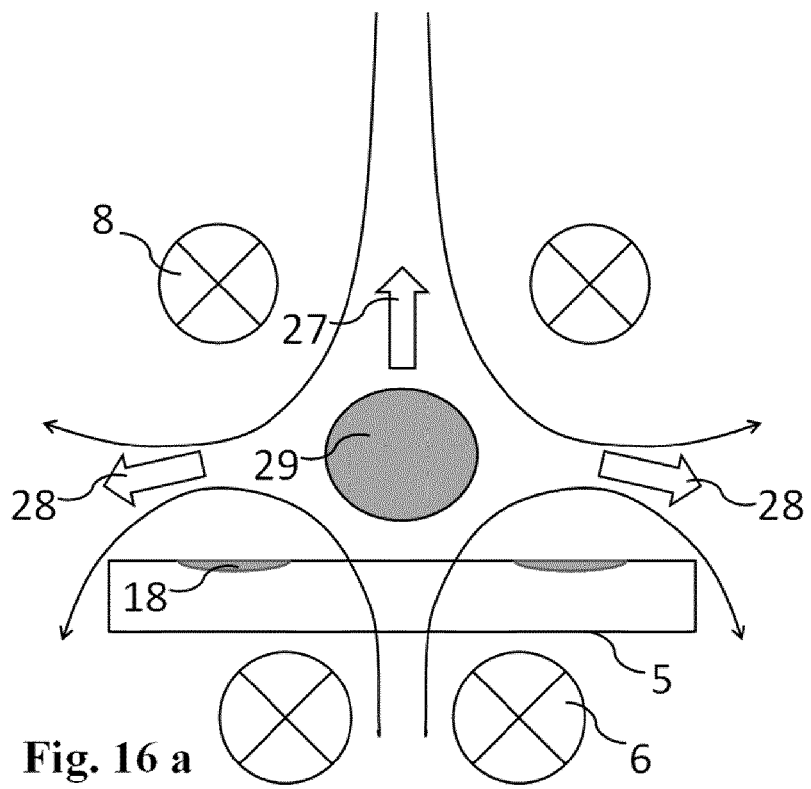
FIG. 16a is a schematic drawing illustrating how electrons are lost when using filtration setup with planar arc cathode where there is not high intensity of magnetic field along whole plasma channel
FIG. 16b is a schematic drawing illustrating how electrons are lost when using filtration setup with rotary arc cathode where there is not high intensity of magnetic field along whole plasma channel
Figure 16:
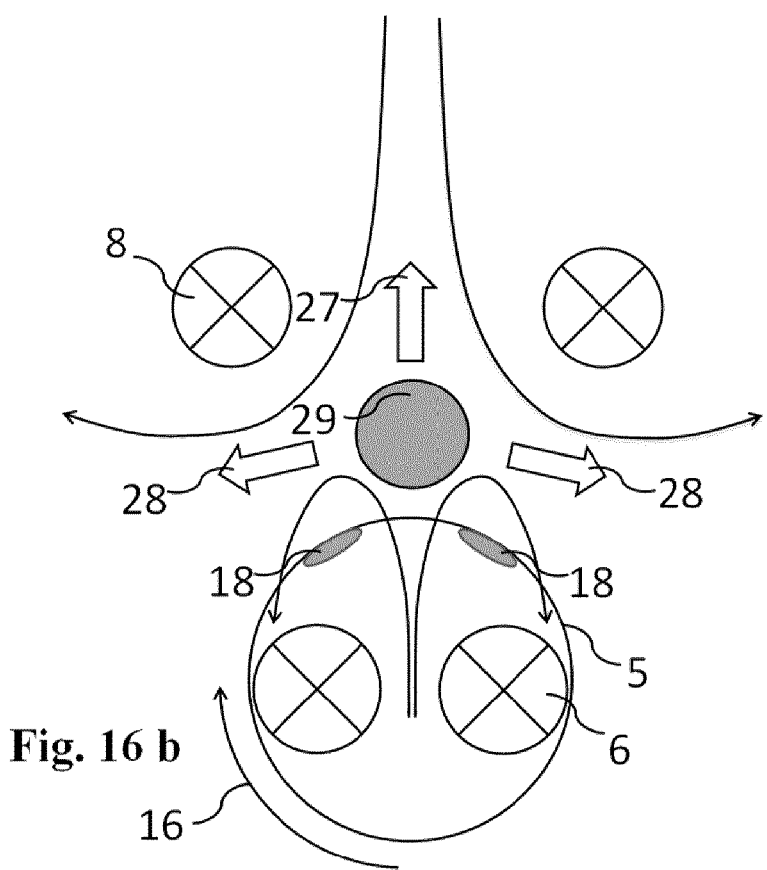
Figure 17:
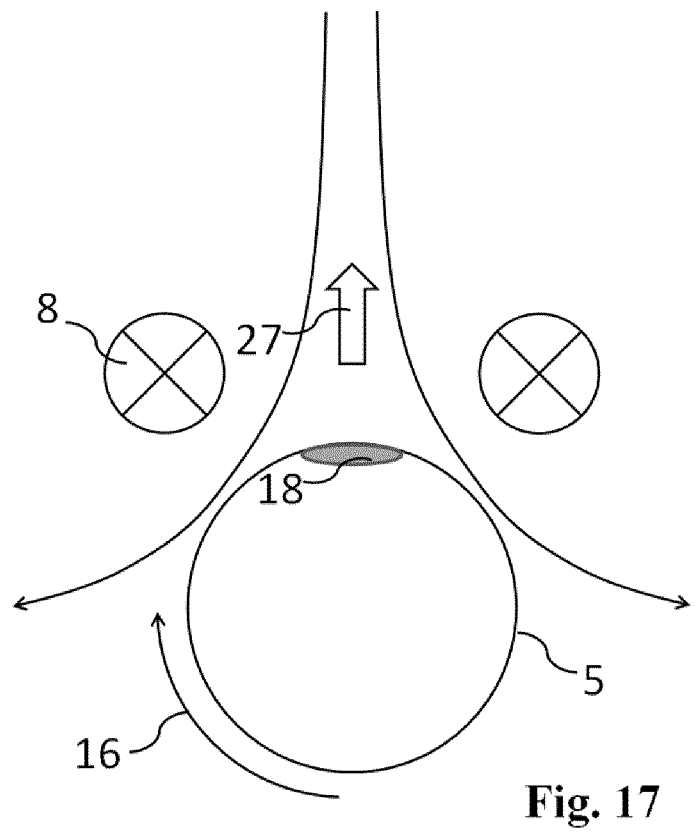
FIG. 17 is a schematic drawing illustrating how electrons are not lost when using filtration setup with rotary arc cathode where there is high intensity of magnetic field along whole plasma channel

Advantage of present invention is illustrated in FIG. 16a, FIG. 16b and FIG. 17.

In FIG. 16a, original approach to the macroparticle filtration for planar arc cathode, where arc spot track is closed 18 defined by magnetic field, due to space with very low magnetic field 29, exists not only main plasma channel 27 whereby ions are guided to the samples, but also escape path 28 for electrons, which substantially decreases yield of the system. In FIG. 16b a similar approach for rotary arc cathode is detailed. In FIG. 17 present invention forbids electrons to find an escape route, so yield of the system is substantially higher.

LIST OF REFERENCE SIGNS 1 substrate holder
2 coating chamber
3 connection to the pumping system
4 door
5 target
6 EM coil
7 ferromagnetic core
8 EM coil
9 water cooled baffle
10 water cooled anode
11 arc generator
12 current source
13 resistor
14 plasma channel
15 substrate bias source
16 cathode rotation
17 MF lines
18 cathode spot track
19 bottom voltage sensor
20 upper voltage sensor
21 MF inside baffle
22 MF in the arc spot position
23 Additional baffle
24 Additional anode
25 place where the arc spot burns
26 EM coil current orientation
27 main channel for electrons
28 escape channel
29 place with zero magnetic field

The invention claimed is:

1. A filtered cathodic vacuum arc deposition apparatus for application of coatings on the substrates in vacuum comprising
 a vacuum coating chamber, substrate holder placed within said vacuum coating chamber,
 at least one consumable arc cathode substantially having cylindrical shape connected to negative pole of current source,
 at least one anode associated with the said arc cathode connected to positive pole of said current source,
 wherein said arc cathode is consumable on its outer cylinder jacket,
 at least one water cooled electromagnetic coil for generating a magnetic field placed between said rotary arc cathode and said substrate holder,
 characterized in that
 said arc cathode is a rotary arc cathode,
 said water cooled electromagnetic coil is elongated donut shaped and the central region of highest intensity of said magnetic field of the said water cooled electromagnetic coil is placed on line, which is substantially parallel to the rotary arc cathode axis,
 magnetic field lines generated by said water cooled electromagnetic coil are substantially constricted in the space between said rotary arc cathode and said substrate holder,
 wherein said anode is positioned in a way arc discharge burns from said rotary arc cathode through said water cooled electromagnetic coil to said anode.

2. A filtered cathodic vacuum arc deposition apparatus according to claim 1 wherein the inner side of said water cooled electromagnetic coil is provided with baffles, reflecting macroparticles.

3. A filtered cathodic vacuum arc deposition apparatus according to claim 1 wherein said water cooled electromagnetic coil is movable along the said axis of rotation of said rotary arc cathode.

4. A filtered cathodic vacuum arc deposition apparatus according to claim 1 wherein an additional magnetic field source oriented opposite to the said magnetic field is placed within the said rotary arc cathode.

5. A filtered cathodic vacuum arc deposition apparatus according to claim 4 wherein at least part of the said additional magnetic field source is ferromagnetic core movable along the said axis of rotation of said rotary arc cathode.

6. A filtered cathodic vacuum arc deposition apparatus according to claim 1 wherein an additional anode is placed between said rotary arc cathode and said water cooled electromagnetic coil, wherein the arc current generated by said current source is divided into said additional anode and said anode, wherein the said arc current ratio of arc current burning against the said additional anode to arc current burning against said anode is in range 0.1-10.

7. A method for application of coatings for graphite target material, on the substrates in coating apparatus according to claim 1, further comprising
 two arc sensors located in the places occupied by the plasma channel, when arc spot reaches a first end and a second end, respectively, of said rotary arc cathode,
 the method comprising steps of
 generating the arc between the rotary arc cathode at a first end position of said consumable rotary arc cathode and associated anode to create the plasma near the place where said magnetic field lines are substantially perpendicular to the said rotary arc cathode surface where the arc spot is moving,
 cathode rotation shifts said arc spot from the place where said magnetic field lines are entering said rotary arc cathode perpendicular to the said rotary arc cathode outer cylinder jacket to the place of higher magnetic field component which is tangential to the said rotary arc cathode outer cylinder jacket by rotating the target, thereby accelerating the movement of the said arc spot on said rotary arc cathode outer cylinder jacket in the direction of said axis of rotation of said rotary arc cathode, when said arc spot reaches a second end position of said consumable rotary arc cathode, one of these actions are taken:

either arc is switched off and reignited or said arc spot movement direction is reversed, wherein the position of the arc is evaluated by said arc sensor.

8. Method according to claim 7, where said arc spot movement direction is reversed by changing rotation direction of said rotary arc cathode.

9. Method according to claim 7, where said arc spot movement direction is reversed by changing orientation of said water cooled electromagnetic coil current.

10. A filtered cathodic vacuum arc deposition apparatus according to claim 2 wherein said water cooled electromagnetic coil is movable along the said axis of rotation of said rotary arc cathode.

11. A filtered cathodic vacuum arc deposition apparatus according to claim 2 wherein an additional magnetic field source oriented opposite to the said magnetic field is placed within the said rotary arc cathode.

12. A filtered cathodic vacuum arc deposition apparatus according to claim 11 wherein at least part of the said additional magnetic field source is ferromagnetic core movable along the said axis of rotation of said rotary arc cathode.

13. A filtered cathodic vacuum arc deposition apparatus according to claim 2 wherein an additional anode is placed between said rotary arc cathode and said water cooled electromagnetic coil, wherein the arc current generated by said current source is divided into said additional anode and said anode, wherein the said arc current ratio of arc current burning against the said additional anode to arc current burning against said anode is in range 0.1-10.

14. A filtered cathodic vacuum arc deposition apparatus according to claim 3 wherein an additional anode is placed between said rotary arc cathode and said water cooled electromagnetic coil, wherein the arc current generated by said current source is divided into said additional anode and said anode, wherein the said arc current ratio of arc current burning against the said additional anode to arc current burning against said anode is in range 0.1-10.

15. A filtered cathodic vacuum arc deposition apparatus according to claim 4 wherein an additional anode is placed between said rotary arc cathode and said water cooled electromagnetic coil, wherein the arc current generated by said current source is divided into said additional anode and said anode, wherein the said arc current ratio of arc current burning against the said additional anode to arc current burning against said anode is in range 0.1-10.

16. A filtered cathodic vacuum arc deposition apparatus according to claim 5 wherein an additional anode is placed between said rotary arc cathode and said water cooled electromagnetic coil, wherein the arc current generated by said current source is divided into said additional anode and said anode, wherein the said arc current ratio of arc current burning against the said additional anode to arc current burning against said anode is in range 0.1-10.

17. A method for application of coatings for low arc spot speed target materials on the substrates in coating apparatus according to claim 2, further comprising two arc sensors located in the places occupied by the plasma channel, when arc spot reaches a first end and a second end, respectively, of said rotary arc cathode, the method comprising steps of generating the arc between the rotary arc cathode at a first end position of said consumable rotary arc cathode and associated anode to create the plasma near the place where said magnetic field lines are substantially perpendicular to the said rotary arc cathode surface where the arc spot is moving, cathode rotation shifts said arc spot from the place where said magnetic field lines are entering said rotary arc cathode perpendicular to the said rotary arc cathode outer cylinder jacket to the place of higher magnetic field component which is tangential to the said rotary arc cathode outer cylinder jacket by rotating the target, thereby accelerating the movement of the said arc spot on said rotary arc cathode outer cylinder jacket in the direction of said axis of rotation of said rotary arc cathode, when said arc spot reaches a second end position of said consumable rotary arc cathode, one of these actions are taken:

either arc is switched off and reignited or said arc spot movement direction is reversed, wherein the position of the arc is evaluated by said arc sensor.

18. A method for application of coatings for graphite target materials, on the substrates in coating apparatus according to claim 3, further comprising two arc sensors located in the places occupied by the plasma channel, when arc spot reaches a first end and a second end, respectively, of said rotary arc cathode, the method comprising steps of generating the arc between the rotary arc cathode at a first end position of said consumable rotary arc cathode and associated anode to create the plasma near the place where said magnetic field lines are substantially perpendicular to the said rotary arc cathode surface where the arc spot is moving, cathode rotation shifts said arc spot from the place where said magnetic field lines are entering said rotary arc cathode perpendicular to the said rotary arc cathode outer cylinder jacket to the place of higher magnetic field component which is tangential to the said rotary arc cathode outer cylinder jacket by rotating the target, thereby accelerating the movement of the said arc spot on said rotary arc cathode outer cylinder jacket in the direction of said axis of rotation of said rotary arc cathode, when said arc spot reaches a second end position of said consumable rotary arc cathode, one of these actions are taken:

either arc is switched off and reignited or said arc spot movement direction is reversed, wherein the position of the arc is evaluated by said arc sensor.

19. A method for application of coatings for graphite target materials, on the substrates in coating apparatus according to claim 4, further comprising two arc sensors located in the places occupied by the plasma channel, when arc spot reaches a first end and a second end, respectively, of said rotary arc cathode, the method comprising steps of generating the arc between the rotary arc cathode at a first end position of said consumable rotary arc cathode and associated anode to create the plasma near the place where said magnetic field lines are substantially perpendicular to the said rotary arc cathode surface where the arc spot is moving, cathode rotation shifts said arc spot from the place where said magnetic field lines are entering said rotary arc cathode perpendicular to the said rotary arc cathode outer cylinder jacket to the place of higher magnetic field component which is tangential to the said rotary arc cathode outer cylinder jacket by rotating the target, thereby accelerating the movement of the said arc spot on said rotary arc cathode outer cylinder jacket in the direction of said axis of rotation of said rotary arc cathode, when said arc spot reaches a second end position of said consumable rotary arc cathode, one of these actions are taken:

either arc is switched off and reignited or said arc spot movement direction is reversed, wherein the position of the arc is evaluated by said arc sensor.

20. A method for application of coatings for graphite target materials, on the substrates in coating apparatus according to claim 5, further comprising two arc sensors located in the places occupied by the plasma channel, when arc spot reaches a first end and a second end, respectively, of said rotary arc cathode, the method comprising steps of generating the arc between the rotary arc cathode at a first end position of said consumable rotary arc cathode and associated anode to create the plasma near the place where said magnetic field lines are substantially perpendicular to the said rotary arc cathode surface where the arc spot is moving, cathode rotation shifts said arc spot from the place where said magnetic field lines are entering said rotary arc cathode perpendicular to the said rotary arc cathode outer cylinder jacket to the place of higher magnetic field component which is tangential to the said rotary arc cathode outer cylinder jacket by rotating the target, thereby accelerating the movement of the said arc spot on said rotary arc cathode outer cylinder jacket in the direction of said axis of rotation of said rotary arc cathode, when said arc spot reaches a second end position of said consumable rotary arc cathode, one of these actions are taken:

either arc is switched off and reignited or said arc spot movement direction is reversed, wherein the position of the arc is evaluated by said arc sensor.

21. A method for application of coatings for graphite target materials, on the substrates in coating apparatus according to claim 6, further comprising two arc sensors located in the places occupied by the plasma channel, when arc spot reaches a first end and a second end, respectively, of said rotary arc cathode, the method comprising steps of generating the arc between the rotary arc cathode at a first end position of said consumable rotary arc cathode and associated anode to create the plasma near the place where said magnetic field lines are substantially perpendicular to the said rotary arc cathode surface where the arc spot is moving, cathode rotation shills said arc spot from the place where said magnetic field lines are entering said rotary arc cathode perpendicular to the said rotary arc cathode outer cylinder jacket to the place of higher magnetic field component which is tangential to the said rotary arc cathode outer cylinder jacket by rotating the target, thereby accelerating the movement of the said arc spot on said rotary arc cathode outer cylinder jacket in the direction of said axis of rotation of said rotary arc cathode, when said arc spot reaches a second end position of said consumable rotary arc cathode, one of these actions are taken:

either arc is switched off and reignited or said arc spot movement direction is reversed, wherein the position of the arc is evaluated by said arc sensor.

* * * * *

UNITED STATES PATENT AND TRADEMARK OFFICE
CERTIFICATE OF CORRECTION

PATENT NO.        : 9,127,354 B2
APPLICATION NO.   : 14/362301
DATED             : September 8, 2015
INVENTOR(S)       : Mojmir Jilek, Sr. et al.

Page 1 of 1

It is certified that error appears in the above-identified patent and that said Letters Patent is hereby corrected as shown below:

In the claims

Claim 21, column 16, line 21, change "shills" to --shifts--

Signed and Sealed this
Fifth Day of January, 2016

Michelle K. Lee
*Director of the United States Patent and Trademark Office*